(12) United States Patent
Wu et al.

(10) Patent No.: US 8,587,398 B2
(45) Date of Patent: Nov. 19, 2013

(54) SHIELDED DIFFERENTIAL INDUCTOR

(75) Inventors: Sherry X. Wu, Austin, TX (US);
Mustafa H. Koroglu, Austin, TX (US);
Ramin Khoini-Poorfard, Austin, TX (US); Alessandro Piovaccari, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 923 days.

(21) Appl. No.: 12/570,462

(22) Filed: Sep. 30, 2009

(65) Prior Publication Data
US 2011/0076979 A1 Mar. 31, 2011

(51) Int. Cl.
*H01F 27/32* (2006.01)

(52) U.S. Cl.
USPC ........................................... 336/84 C

(58) Field of Classification Search
USPC ............... 336/200, 232, 84 R, 84 C; 257/531
See application file for complete search history.

(56) References Cited

U.S. PATENT DOCUMENTS

| | | | |
|---|---|---|---|
| 6,753,591 B2 * | 6/2004 | Yu | 257/531 |
| 7,141,883 B2 | 11/2006 | Wei et al. | |
| 7,230,504 B1 | 6/2007 | Marques et al. | |
| 7,262,481 B1 | 8/2007 | Marques | |
| 7,498,656 B2 | 3/2009 | Zhang et al. | |
| 7,501,924 B2 | 3/2009 | Zhang | |
| 7,847,666 B2 * | 12/2010 | Moinian et al. | 336/200 |
| 2003/0222732 A1 * | 12/2003 | Matthaei | 333/99 S |
| 2006/0202789 A1 * | 9/2006 | Hyvonen | 336/200 |
| 2006/0220778 A1 | 10/2006 | Marques | |
| 2006/0226943 A1 | 10/2006 | Marques | |
| 2008/0180187 A1 * | 7/2008 | Kinget et al. | 331/181 |
| 2012/0242446 A1 * | 9/2012 | Wu et al. | 336/192 |

OTHER PUBLICATIONS

Reiha et al., "High-Q Differential Inductors for RFIC Design", Microwave Conference, 2003, 1 pg.
Yang, Design Considerations of Differential Inductors in CMOS Technology, available before the Sep. 30, 2009 filing date of the current application, 4 pgs.

* cited by examiner

*Primary Examiner* — Tuyen Nguyen
(74) *Attorney, Agent, or Firm* — Egan, Peterman, Enders LLP

(57) ABSTRACT

A shielded differential inductor forms a high quality factor (high-Q) inductor that is configured to attenuate frequency spurs and/or noise from magnetic coupling generated by electrical structures on or off of a substrate as well as interference received by other components from magnetic coupling generated by the inductor. The shielded differential inductor includes a differential inductor and a shield that substantially isolates the electrical field between the inductor and the substrate to reduce substrate current loss. The shield includes sets of finger structures that extend beyond the width of the inductor and a hub and spoke configuration of ground conductors that connect the sets of finger structures to ground.

20 Claims, 12 Drawing Sheets

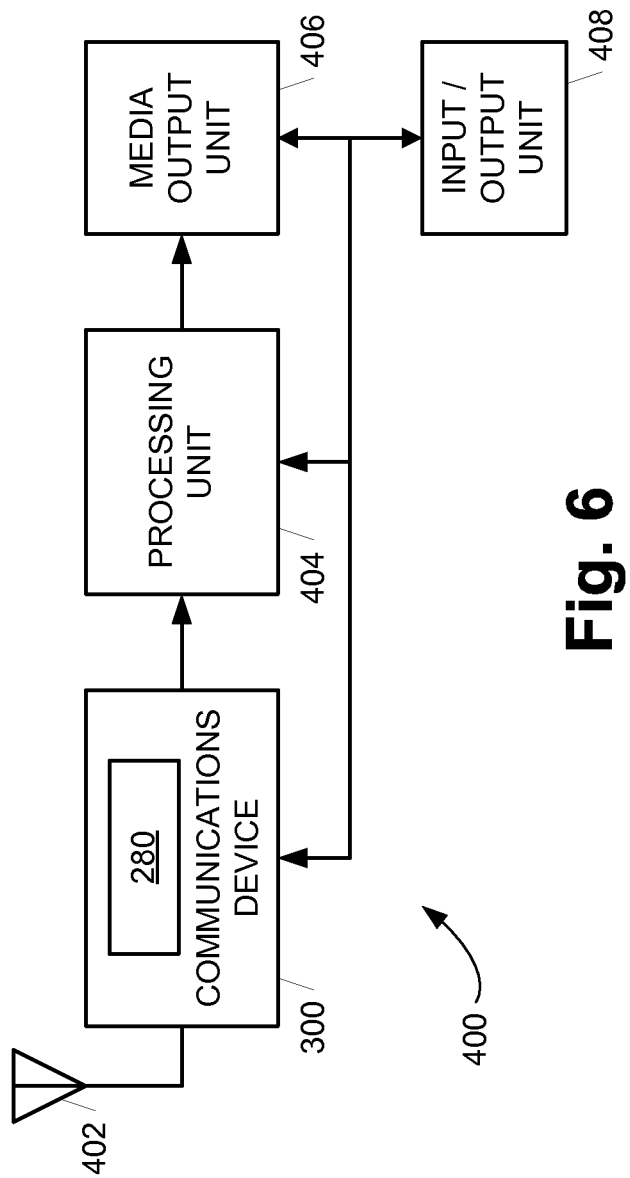

SHIELDED DIFFERENTIAL INDUCTOR

BACKGROUND

Analog and mixed signal integrated circuits may include passive components such as capacitors and inductors that are formed on a semiconductor substrate. In operation, these components may produce or receive interference that may cause undesired behavior on other components on the substrate. The received interference may originate in components on the substrate or components in proximity to the substrate (e.g., bond wires or circuitry on a printed circuit board). In some instances, the interference may transfer to the other components through magnetic coupling or across the substrate and may take the form of frequency spurs or noise. For example, a component on the substrate may generate a mutual inductance with another component on or off of the substrate that produces an induced voltage that may take the form of a spur or noise. The induced voltage may be proportional to the amount of interference and the mutual inductance. Circuitry on the substrate, therefore, may be designed to minimize the effects of the mutual inductance between a component on the substrate and a component on or off of the substrate.

SUMMARY

According to one exemplary embodiment, an apparatus formed on a substrate is provided. The apparatus includes an inductor and a shield including a first set of finger structures formed in proximity to a first portion of the inductor and a ground connection connected to the first set of finger structures. Each of the finger structures in the first set extends beyond a width of the first portion of the inductor in a first direction that is orthogonal to a second direction of current flow in the first portion of the inductor.

According to another exemplary embodiment, a controlled oscillator formed on a substrate is provided. The controlled oscillator includes an amplifier, a varactor, and a differential inductor coupled in parallel with the amplifier and varactor. The differential inductor has a shield that includes a plurality of sets of finger structures each connected to a ground connection. Each of the plurality of sets of finger structures is formed in proximity to a different portion of the inductor such that the finger structures of each set extend beyond a width of the inductor in a direction that is orthogonal to the direction of current flow in the corresponding portion of the inductor.

According to a further exemplary embodiment, a media system is provided. The media system includes a communications device configured to receive an analog input signal and generate an output signal and a processing unit configured to generate a media signal in response to the output signal from the communications device. The communications device includes a controlled oscillator, a mixer, intermediate frequency (IF) filter circuitry, and processing circuitry. The controlled oscillator includes a differential inductor coupled in parallel with an amplifier and a varactor. The differential inductor has a shield that includes a plurality of sets of finger structures each connected to a ground connection. Each of the plurality of sets of finger structures is formed in proximity to a different portion of the inductor such that the finger structures of each set extend beyond a width of the inductor in a direction that is orthogonal to the direction of current flow in the corresponding portion of the inductor. The controlled oscillator configured to generate a mixing signal using the differential inductor. The mixer is configured to generate an analog baseband signal from the analog input signal and the mixing signal. The IF filter circuitry is configured to convert the analog baseband signal to a digital baseband signal, and the processing circuitry configured to generate the output signal responsive to the digital baseband signal from the IF filter circuitry.

BRIEF DESCRIPTION OF THE DRAWINGS

FIG. 6 is a block diagram illustrating one embodiment of a media system that includes a communications device.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

As described herein, a shielded differential inductor forms a high quality factor (high-Q) inductor that is configured to attenuate frequency spurs and/or noise from magnetic coupling generated by electrical structures on or off of a substrate as well as interference received by other components from magnetic coupling generated by the inductor. The shielded differential inductor includes a differential inductor and a shield that substantially isolates the electrical field between the inductor and the substrate to reduce substrate current loss. The shield includes sets of finger structures that extend beyond the width of the inductor and a hub and spoke configuration of ground conductors that connect the sets of finger structures to ground. Core circuitry that may combine with the inductor to form a controlled oscillator may be symmetrically placed relative to the inductor to minimize current loss and improve the Q of the inductor.

Figure 1A:
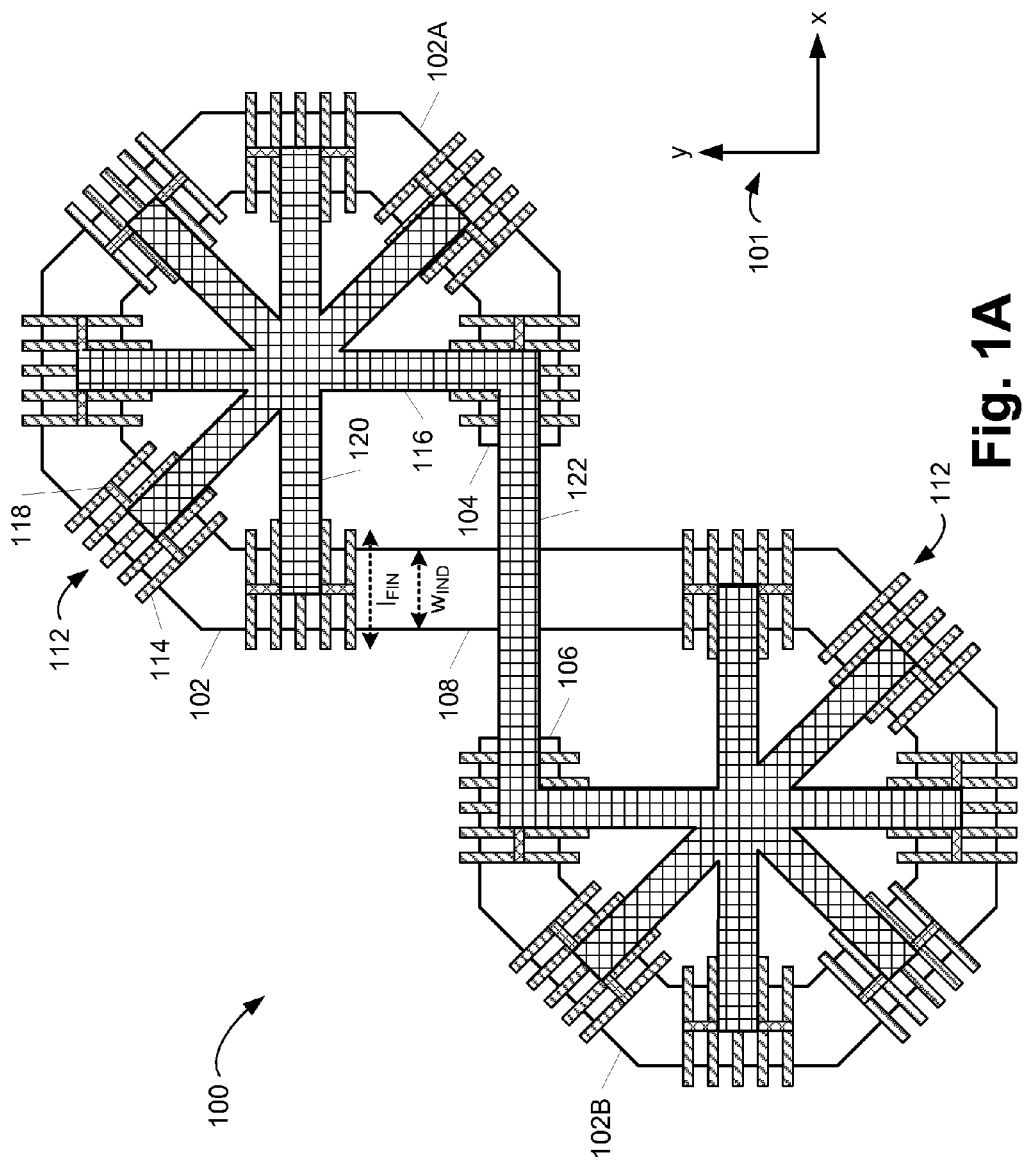
FIGS. 1A-1E are diagrams illustrating one embodiment of a shielded differential inductor.

FIG. 1A is a bottom view diagram illustrating an embodiment of a shielded differential inductor 100 in an x-y plane 101. Shielded differential inductor 100 includes a differential inductor 102 and a shield 112 formed in proximity to differential inductor 102.

Differential inductor 102 includes a pair of conductive loops 102A and 102B. Loop 102A includes a terminal 104, and loop 102B includes a terminal 106. Loops 102A and 102B are arranged substantially in the shape of a figure eight in x-y plane 101. The figure eight shape of loops 102A and 102B includes a disconnected or electrically open region between terminals 104 and 106 and a conductive connection 108 between loops 102A and 102B. In the embodiment of FIG. 1A, each loop 102A and 102B forms a substantially octagonal shape that is symmetric in the x and y directions of x-y plane 101. In other embodiments, each loop 102A and 102B may form other substantially polygonal and/or rounded (e.g., circular) shapes with or without symmetry in the x and/or y directions of x-y plane 101. Loops 102A and 102B are configured such that a magnetic field of loop 102A at least partially cancels a magnetic field of loop 102B. The magnetic fields of loops 102A and 102B may be generated by loops 102A and 102B, respectively, or received by loops 102A and 102B, respectively.

Shield 112 includes sets of conductive finger structures 114 connected to a ground conductor 116 via respective conductive connectors 118. Each set of figure structures 114 includes any suitable number of elongated finger structures that are formed to be substantially parallel to one another in x-y plane 101. Each set of finger structures 114 is also formed in proximity to a respective portion of inductor 102 such that the finger structures of each respective set are configured in a direction that is substantially orthogonal to the direction of the current flow in the respective portion of inductor 102. Each finger structure extends beyond each edge of a respective portion of inductor 102 in x-y plane 101 (i.e., beyond the width of inductor 102) such that a length of each finger ($l_{FIN}$) is greater than a width ($w_{IND}$) of the respective portion of inductor 102 in x-y plane 101. Each finger structure of each set connects to a respective connector 118 which in turn connects to ground conductor 116.

Ground conductor 116 includes elongated portions that form spokes 120 that connect to connectors 118. Each spoke 120 extends in a direction that is parallel to the direction of the respective set of finger structures 114. The respective sets of spokes 120 of loops 102A and 102B converge and connect at respective hubs that are at or near respective center points of loops 102A and 102B in the x-y plane. Ground conductor 116 also includes a conductor 122 that connects the set of spokes 120 of loop 102A with the set of spokes of loop 102B.

Each connector 118 connects only to a corresponding set of finger structures 114 and a corresponding spoke 120. Each connector 118 extends in a direction that is orthogonal to the direction of a corresponding set of finger structures 114 and a corresponding spoke 120 in x-y plane 101. Each connector 118 does not extend substantially beyond the outer finger structures of a corresponding set of finger structures 114 in x-y plane 101 such that adjacent connectors 118 of adjacent sets of finger structures 114 do not directly connect to one another (i.e., connectors 118 are separated from one another).

Figure 1B:
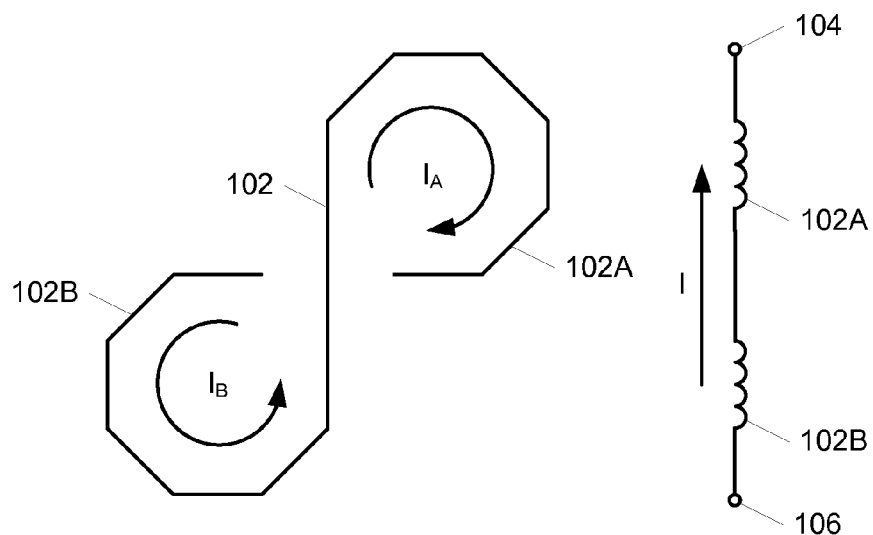

As shown in FIG. 1B, loops 102A and 102B each form inductive loops that are coupled in series and generate electrical current that flows in opposite directions. For example, loop 102A may generate current $I_A$ that flows in a clockwise direction and loop 102B may generate current $I_B$ that flows in a counterclockwise direction as shown. Because the currents of loops 102A and 102B flow in opposite directions, the magnetic fields generated or received by loops 102A and 102B at least partially cancel one another.

Figure 1C:
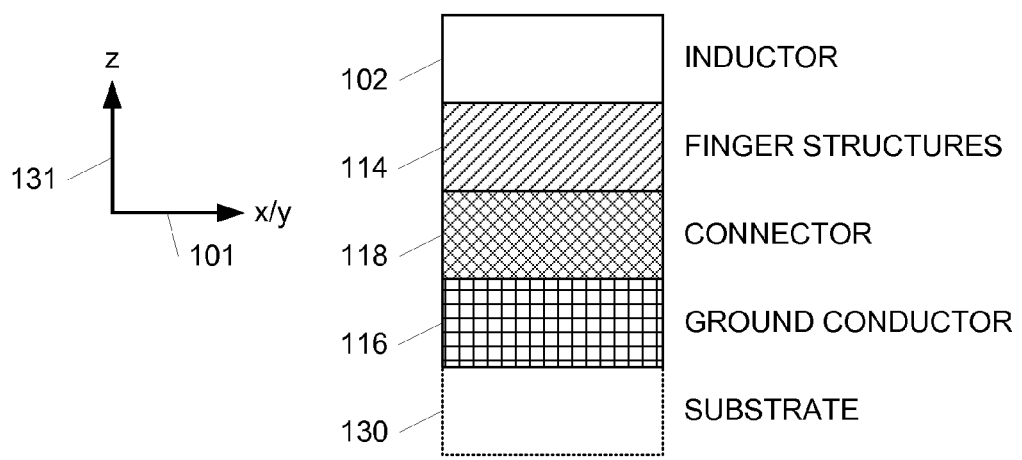

Inductor 102 and shield 112 may be formed in any suitable number of layers of material on a semiconductor substrate 130 using any suitable semiconductor manufacturing process as shown in FIG. 1C. As shown in FIG. 1C, the layers that form shield 112 and inductor 130 are formed on a substrate 130 as indicated by the z direction 131. Although not shown in FIG. 1C, any number of layers may be formed between substrate 130 the layers that form shield 112 and inductor 102.

In one embodiment, ground conductor 116 and connector 118 may be formed in one or more conductive metal layers, finger structures 114 may be formed in one or more conductive polysilicon layers, and inductor 102 may be formed in one or more conductive metal layers. In other embodiments, ground conductor 116, connector 118, finger structures 114, and inductor 102 may be formed in other suitable types and/or numbers of conductive layers.

In other embodiments, the layers that include ground conductor 116 and finger structures 114 may be swapped such that ground conductor 116 is formed in a layer between the layer that includes connectors 118 and the layer that includes inductor 102 and finger structures 114 are formed in a layer between substrate 130 and the layer that includes connectors 118.

Shielded differential inductor 100 forms a high quality factor (high-Q) inductor that is configured to attenuate frequency spurs and/or noise from magnetic coupling generated by electrical structures on or off of substrate 130. Shielded differential inductor 100 is also configured to attenuate interference (e.g., frequency spurs and/or noise) received by other components from magnetic coupling generated by inductor 102. By extending the finger structures of shield 112 beyond the width of inductor 102, the sets of finger structures 114 substantially isolate the electrical field between inductor 102 and substrate 130 and reduce substrate current loss. In addition, the finger structures minimize eddy current loss compared to a solid shield to improve the Q of inductor 102.

The extended finger structures may also allow the size of inductor 102 to be changed without changing the size of shield 112. For example, if a larger or smaller inductor 102 becomes desirable, the size of inductor 102 may be increased or decreased within a range relative to the size of shield 112 and retain the benefits provided by the finger structures extending beyond the width of inductor 102. With a change in size of inductor 102, the finger structures may extend beyond opposing sides of inductor 102 by different lengths. Even with these different lengths, the finger structures continue to substantially isolate the electrical field between inductor 102 and substrate 130 and reduce substrate current loss. Accordingly, size of inductor 102 may be adjusted in a straightforward and cost effective manner.

Figure 1D:
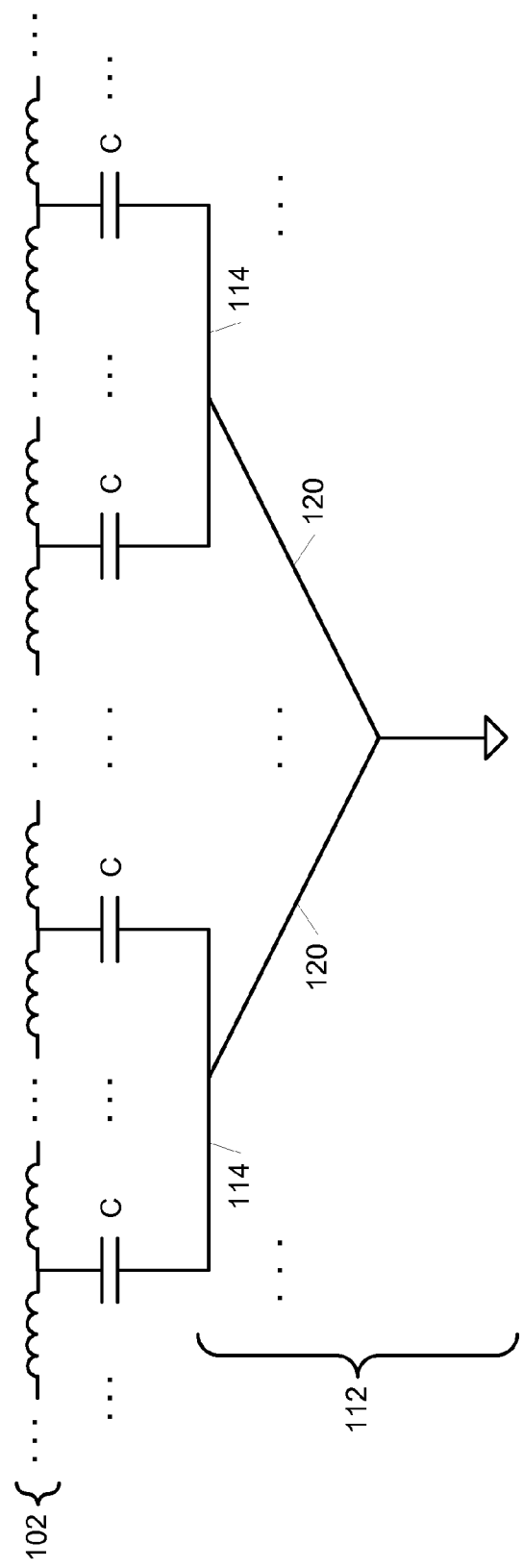

FIG. 1D illustrates a portion of a circuit equivalent of the shielded differential inductor 100. Each finger structure in a set of figure structures 114 effectively forms a capacitance C between a respective portion of inductor 102 and ground conductor 116 via a respective spoke 120. The hub and spoke distribution of the figure structures in shield 112 along with the separation between connectors 118 (shown in FIG. 1A) may prevent a current loop from forming in shield 112 to further minimize the current loss in shield 112.

Figure 1E:
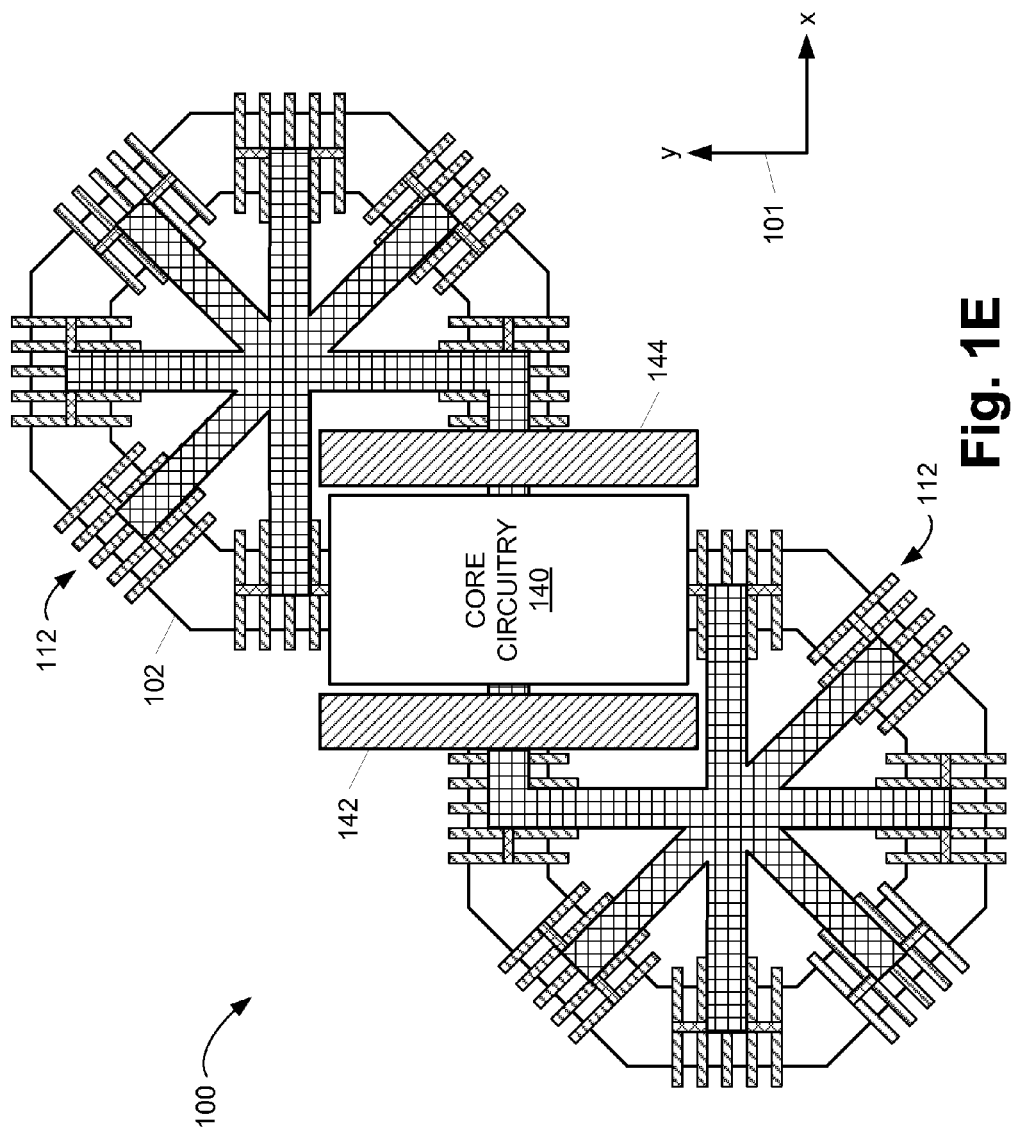
Figure 4:
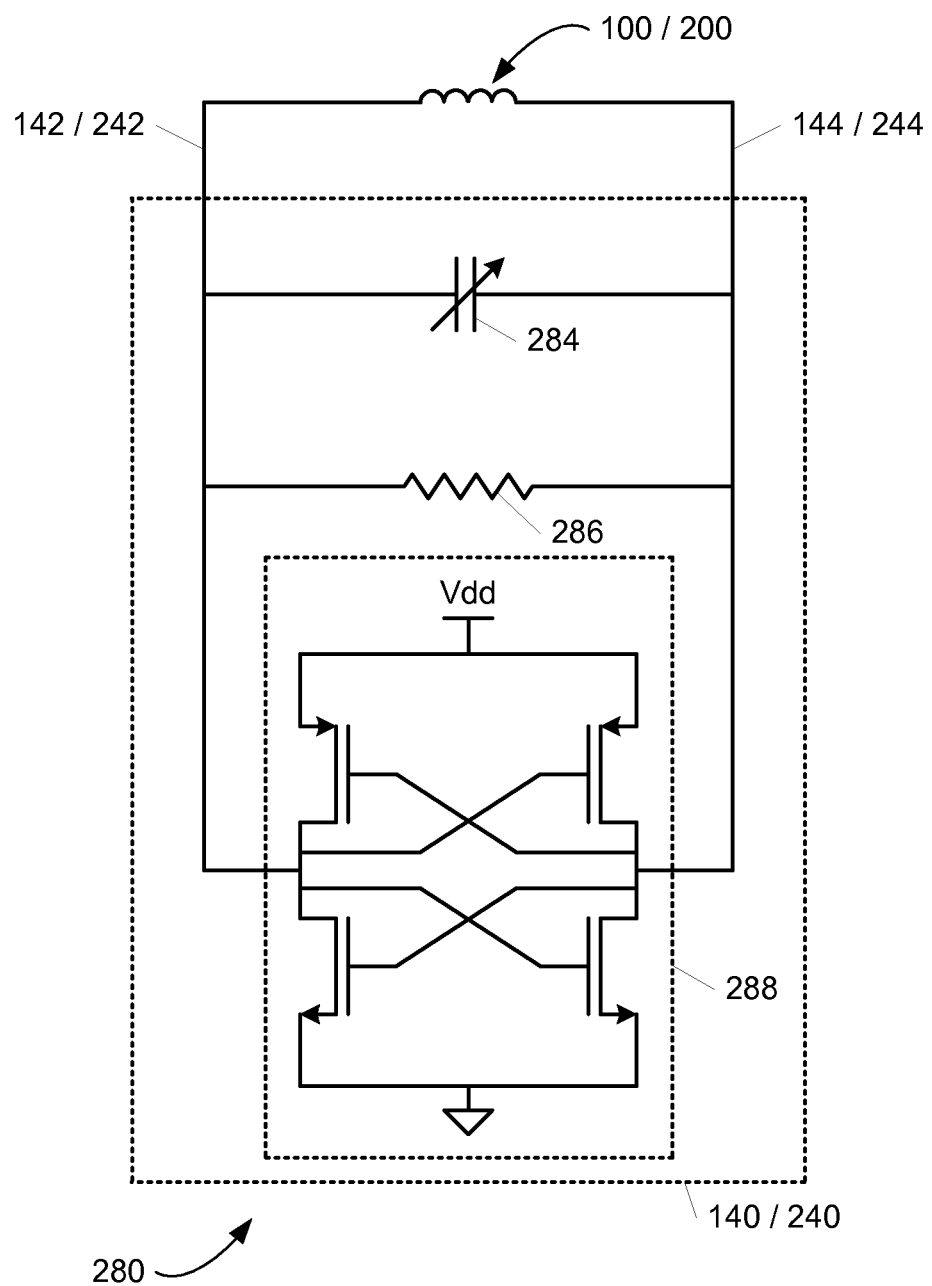
FIG. 4 is a circuit diagram illustrating one embodiment of a controlled oscillator.

In one embodiment shown in FIG. 1E, shielded differential inductor 100 may form a portion of a controlled oscillator (shown in FIG. 4 and described in additional detail below) along with a core circuitry 140 and connecting bars 142 and 144. As shown in FIG. 4, core circuitry 140 may be formed in proximity to inductor 102 and may include a varactor 284, a resistor 286 that represents the lossy component from inductor 100, varactor 284, etc., and an amplifier 288 coupled in parallel with differential inductor 100.

Core circuitry 140 may be symmetrically located under the crossover region and along the y-axis of inductor 102 to minimize the magnetic coupling and Q degradation of inductor 102 caused by the metallization effect of core circuitry 140. Because inductor 102 is a differential inductor, the minimum voltage swing of inductor 102 occurs at a symmetry point of inductor 102 in the x and y-axes. Core circuitry 140 may be symmetrically placed with respect to this symmetry point to minimize the capacitive coupling between core circuitry 140 and inductor 102. This placement of core circuitry 140 also minimizes the routing distance between inductor 102 and varactor 284 to minimize the loss between inductor 102 and varactor 284 and increase the quality factor of the LC tank formed by inductor 102 and varactor 284. Connecting bars 142 and 144 are configured to provide good conductivity between inductor 102 and core circuitry 140 to reduce current loss on connecting bars 142 and 144 as well as eddy current loss caused by connecting bars 142 and 144. This placement of core circuitry 140 further minimizes electric coupling between the crossover section of inductor 102 and core circuitry 140 because of the minimum signal swing at the crossover point of differential inductor 102.

In addition, varactor 284 of core circuitry 140 may be divided into sections to provide a symmetric layout of core circuitry 140. As a result, impacts from core circuitry 140 on inductor 102 may be differentially symmetric.

The area of substrate 130 underneath inductor 102 may be configured to include as much raw substrate (i.e., neither PWell or NWell) as possible via a free process mask. A portion underneath core circuitry 140 may include areas of PWell or NWell, but the remaining area of substrate 130 underneath inductor 102 includes raw substrate. By doing so, the resistivity of substrate 130 is increased to result in a decrease of any induced substrate current and an increase of the quality factor of the LC tank formed by inductor 102 and varactor 284.

Figure 2A:
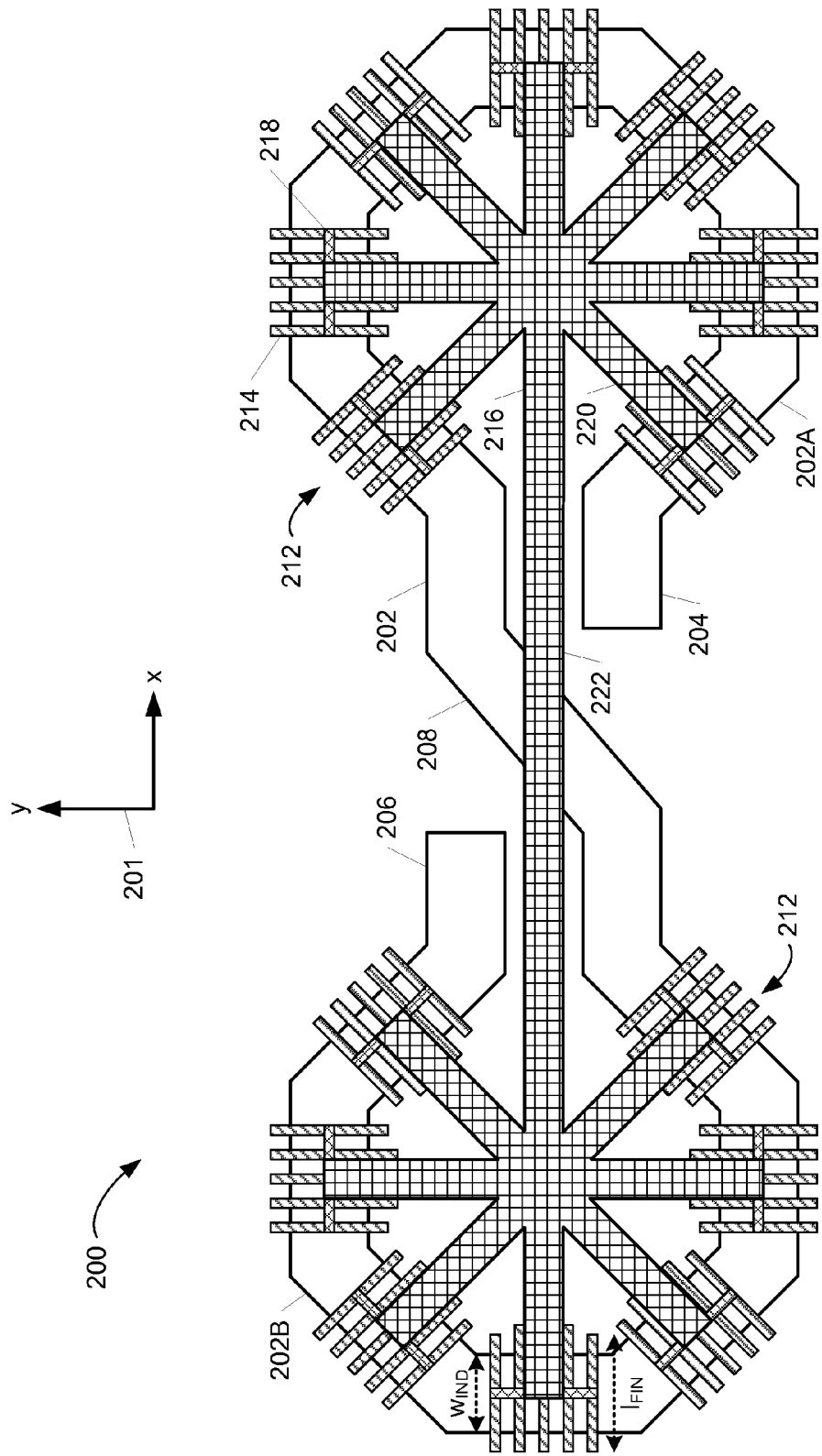
FIGS. 2A-2E are diagrams illustrating another embodiment of a shielded differential inductor.

FIG. 2A is a bottom view diagram illustrating another embodiment of a shielded differential inductor 200 in an x-y plane 201. Shielded differential inductor 200 includes a differential inductor 202 and a shield 212 formed in proximity to differential inductor 202.

Differential inductor 202 includes a pair of conductive loops 202A and 202B. Loop 202A includes a terminal 204, and loop 202B includes a terminal 206. Loops 202A and 202B are arranged substantially in the shape of an extended figure eight in x-y plane 101. The extended figure eight shape of loops 202A and 202B includes a disconnected or electrically open region between terminals 204 and 206 and a conductive connection 208 between loops 202A and 202B. In the embodiment of FIG. 2A, each loop 202A and 202B forms a substantially octagonal shape that is symmetric in the x and y directions of x-y plane 201. In other embodiments, each loop 202A and 202B may form other substantially polygonal and/or rounded (e.g., circular) shapes with or without symmetry in the x and/or y directions of x-y plane 201. Loops 202A and 202B are configured such that a magnetic field of loop 202A at least partially cancels a magnetic field of loop 202B. The magnetic fields of loops 202A and 202B may be generated by loops 102A and 202B, respectively, or received by loops 202A and 202B, respectively.

Shield 212 includes sets of conductive finger structures 214 connected to a ground conductor 216 via respective conductive connectors 218. Each set of figure structures 214 includes any suitable number of elongated finger structures that are formed to be substantially parallel to one another in x-y plane 201. Each set of finger structures 214 is also formed in proximity to a respective portion of inductor 202 such that the finger structures of each respective set are configured in a direction that is substantially orthogonal to the direction of the current flow in the respective portion of inductor 202. Each finger structure extends beyond each edge of a respective portion of inductor 202 in x-y plane 201 (i.e., beyond the width of inductor 202) such that a length of each finger ($l_{FIN}$) is greater than a width ($w_{IND}$) of the respective portion of inductor 202 in x-y plane 201. Each finger structure of each set connects to a respective connector 218 which in turn connects to ground conductor 216.

Ground conductor 216 includes elongated portions that form spokes 220 that connect to connectors 218. Each spoke 220 extends in a direction that is parallel to the direction of the respective set of finger structures 214. The respective sets of spokes 220 of loops 202A and 202B converge and connect at respective hubs that are at or near respective center points of loops 202A and 202B in the x-y plane. Ground conductor 216 also includes a conductor 222 that connects the set of spokes 220 of loop 202A with the set of spokes of loop 202B.

Each connector 218 connects only to a corresponding set of finger structures 214 and a corresponding spoke 220. Each connector 218 extends in a direction that is orthogonal to the direction of a corresponding set of finger structures 214 and a corresponding spoke 220 in x-y plane 201. Each connector 218 does not extend substantially beyond the outer finger structures of a corresponding set of finger structures 214 in x-y plane 101 such that adjacent connectors 218 of adjacent sets of finger structures 214 do not directly connect to one another (i.e., connectors 218 are separated from one another).

Figure 2B:
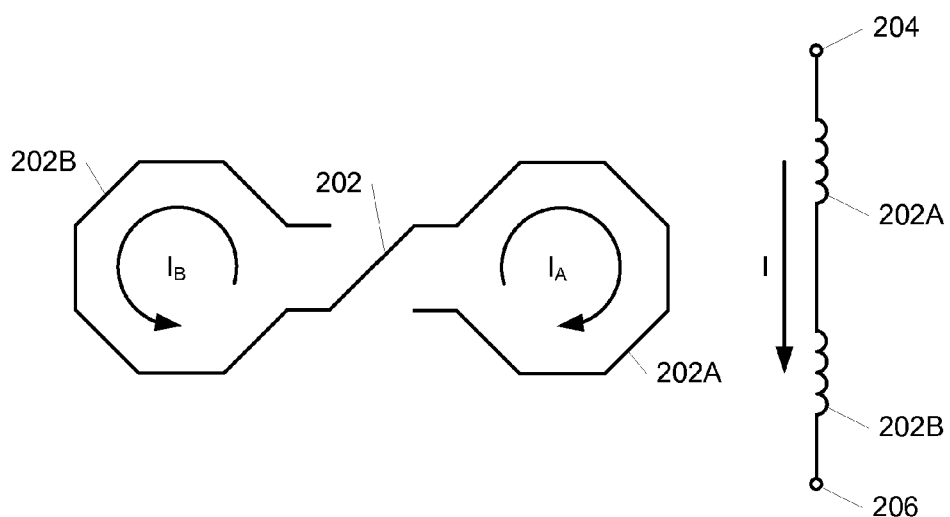

As shown in FIG. 2B, loops 202A and 202B each form inductive loops that are coupled in series and generate electrical current that flows in opposite directions. For example, loop 202A may generate current $I_A$ that flows in a clockwise direction and loop 202B may generate current $I_B$ that flows in a counterclockwise direction as shown. Because the currents of loops 202A and 202B flow in opposite directions, the magnetic fields generated or received by loops 202A and 202B at least partially cancel one another.

Figure 2C:
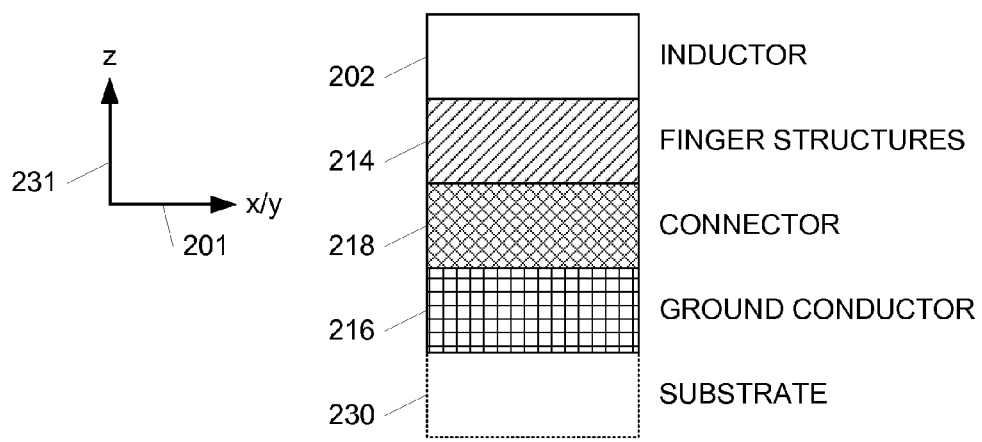

Inductor 202 and shield 212 may be formed in any suitable number of layers of material on a semiconductor substrate 130 using any suitable semiconductor manufacturing process as shown in FIG. 2C. As shown in FIG. 2C, the layers that form shield 212 and inductor 230 are formed on a substrate 230 as indicated by the z direction 231. Although not shown in FIG. 2C, any number of layers may be formed between substrate 230 the layers that form shield 212 and inductor 202.

In one embodiment, ground conductor 216 and connector 218 may be formed in one or more conductive metal layers, finger structures 214 may be formed in one or more conductive polysilicon layers, and inductor 202 may be formed in one or more conductive metal layers. In other embodiments, ground conductor 216, connector 218, finger structures 214, and inductor 202 may be formed in other suitable types and/or numbers of conductive layers.

In other embodiments, the layers that include ground conductor 216 and finger structures 214 may be swapped such that ground conductor 216 is formed in a layer between the layer that includes connectors 218 and the layer that includes inductor 202 and finger structures 214 are formed in a layer between substrate 230 and the layer that includes connectors 218.

Shielded differential inductor 200 forms a high quality factor (high-Q) inductor that is configured to attenuate frequency spurs and/or noise from magnetic coupling generated by electrical structures on or off of substrate 230. Shielded differential inductor 200 is also configured to attenuate interference (e.g., frequency spurs and/or noise) received by other components from magnetic coupling generated by inductor 202. By extending the finger structures of shield 212 beyond the width of inductor 202, the sets of finger structures 214 substantially isolate the electrical field between inductor 202 and substrate 230 and reduce substrate current loss. In addition, the finger structures minimize eddy current loss compared to a solid shield to improve the Q of inductor 202.

The extended figure structures may also allow the size of inductor 202 to be changed without changing the size of shield 212. For example, if a larger or smaller inductor 202 becomes desirable, the size of inductor 202 may be increased or decreased within a range relative to the size of shield 112 and retain the benefits provided by the finger structures extending beyond the width of inductor 202. With a change in size of inductor 202, the finger structures may extend beyond opposing sides of inductor 202 by different lengths. Even with these different lengths, the finger structures continue to substantially isolate the electrical field between inductor 202 and substrate 230 and reduce substrate current loss. Accordingly, size of inductor 202 may be adjusted in a straightforward and cost effective manner.

Figure 2D:
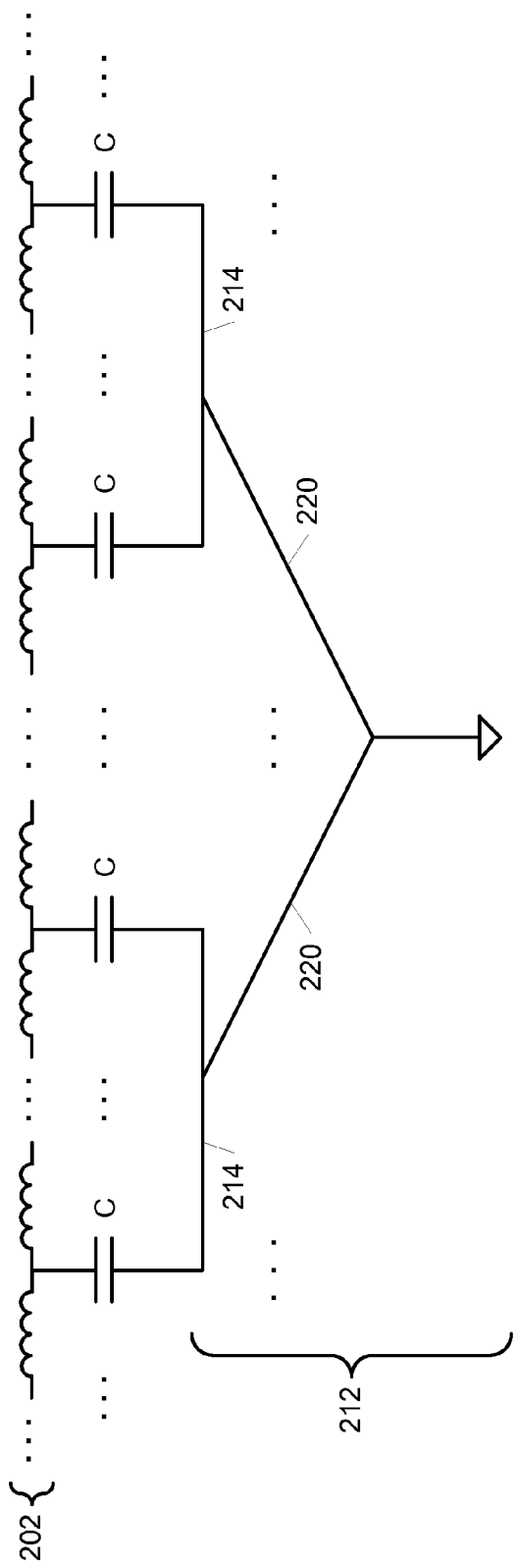

FIG. 2D illustrates a portion of a circuit equivalent of the shielded differential inductor 200. Each finger structure in a set of figure structures 214 effectively forms a capacitance C between a respective portion of inductor 202 and ground conductor 216 via a respective spoke 220. The hub and spoke distribution of the figure structures in shield 212 along with the separation between connectors 218 (shown in FIG. 2A) may prevent a current loop from forming in shield 212 to further minimize the current loss in shield 212.

Figure 2E:
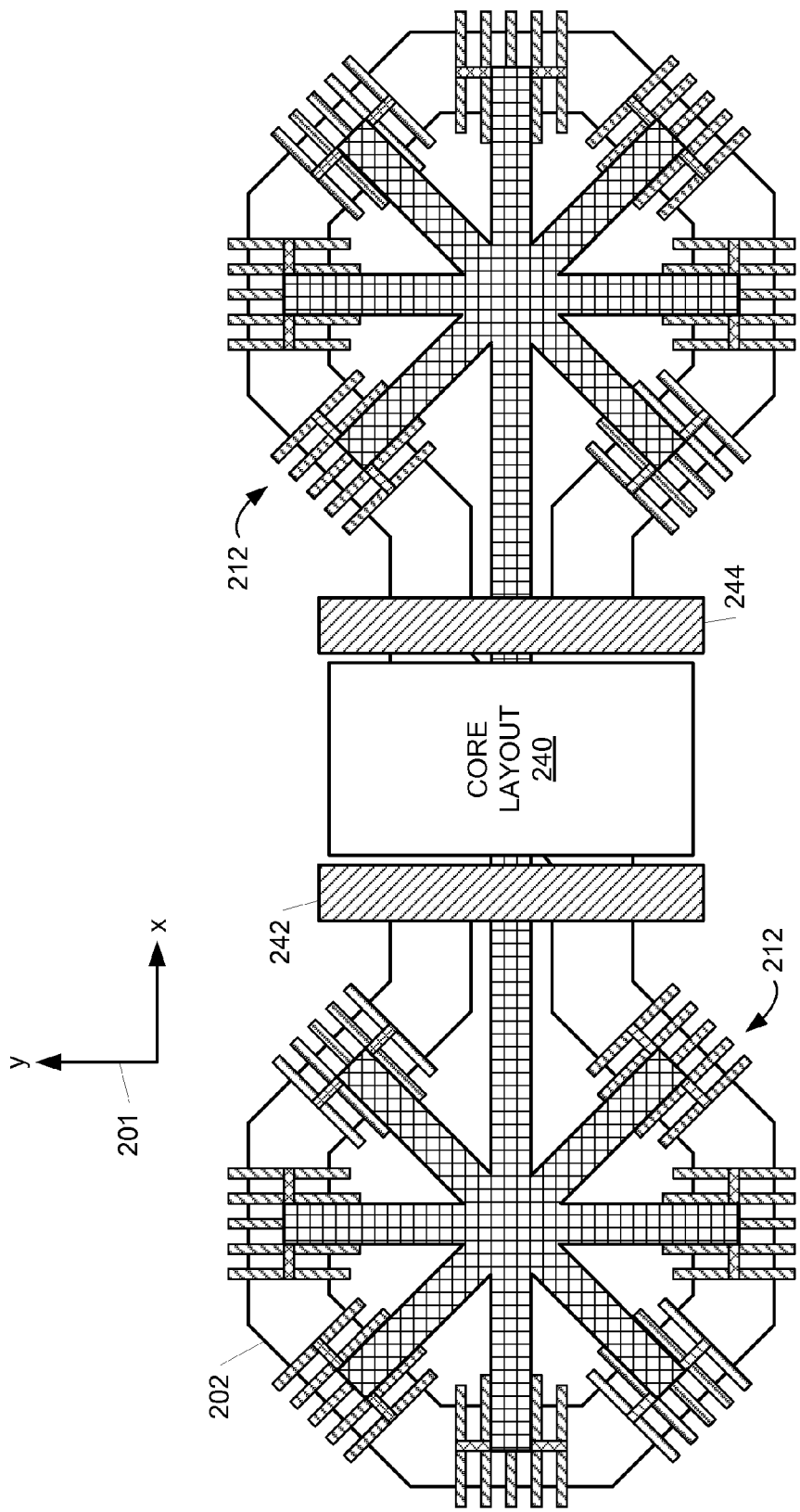

In one embodiment shown in FIG. 2E, shielded differential inductor 200 may form a portion of a controlled oscillator (shown in FIG. 4 and described in additional detail below) along with a core circuitry 240 and connecting bars 242 and 244. As shown in FIG. 4, core circuitry 240 may be formed in proximity to inductor 102 and may include varactor 284, resistor 286, and amplifier 288 coupled in parallel with differential inductor 200.

Core circuitry 240 may be symmetrically located under the cross over region and along the y-axis of inductor 202 to minimize the magnetic coupling and Q degradation of inductor 202 caused by the metallization effect of core circuitry 240. Because inductor 202 is a differential inductor, the minimum voltage swing of inductor 202 occurs at a symmetry point of inductor 202 in the x and y-axes. Core circuitry 240 may be symmetrically placed with respect to this symmetry point to minimize the capacitive coupling between core circuitry 240 and inductor 202. This placement of core circuitry 240 also minimizes the routing distance between inductor 202 and varactor 284 to minimize the loss between inductor 202 and varactor 284 and increase the quality factor of the LC tank formed by inductor 202 and varactor 284. Connecting bars 242 and 244 are configured to provide good conductivity between inductor 202 and core circuitry 240 to reduce current loss on connecting bars 242 and 244 as well as eddy current loss caused by connecting bars 242 and 244. This placement of core circuitry 240 further minimizes electric coupling between the crossover section of inductor 202 and core circuitry 240 because of the minimum signal swing at the crossover point of differential inductor 202.

In addition, varactor 284 of core circuitry 240 may be divided into sections to provide a symmetric layout of core circuitry 240. As a result, impacts from core circuitry 240 on inductor 202 may be differentially symmetric.

Figure 3A:
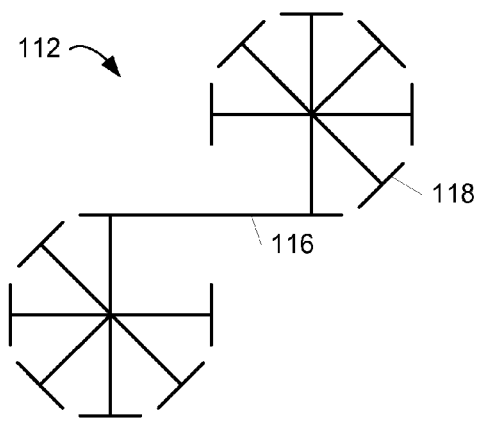
FIGS. 3A-3D are diagrams illustrating embodiments of shields for differential inductors.
Figure 3B:
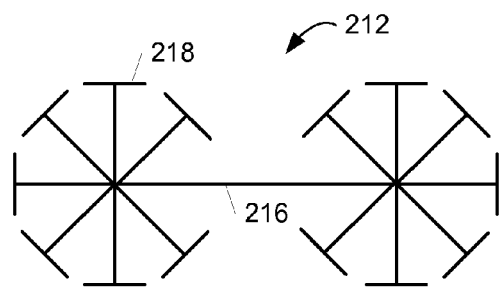

The area of substrate 230 underneath inductor 202 may be configured to include as much raw substrate (i.e., neither PWell or NWell) as possible via a free process mask. A portion underneath core circuitry 240 may include areas of PWell or NWell, but the remaining area of substrate 230 underneath inductor 202 includes raw substrate. By doing so, the resistivity of substrate 230 is increased to result in a decrease of any induced substrate current and an increase of the quality factor of the LC tank formed by inductor 202 and varactor 284. FIGS. 3A-3D are diagrams illustrating various embodiments of ground paths for shields for differential inductors. FIGS. 3A and 3B illustrate the ground paths for shields 112 and 212 for differential inductors 102 and 202, respectively. The ground path for differential inductor 102 includes ground conductor 116 and connectors 118, and the ground path for differential inductor 202 includes ground conductor 216 and connectors 218.

Figure 3C:
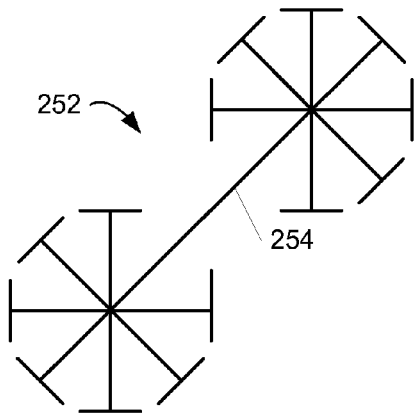
Figure 3D:
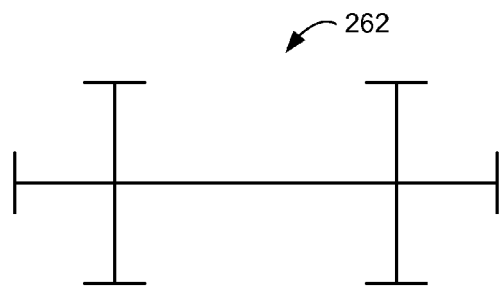

As illustrated by the embodiments of ground paths 252 and 262 in FIGS. 3C and 3D, respectively, various alterations of the ground paths of the embodiments of FIGS. 3A and 3B may be made while maintaining the potential advantages described above. In FIG. 3C, for example, ground path 252 replaces the conductor 122 of shield 112 with a conductor 254 between the hubs of each loop 102A and 102B. As another example, the number of spokes of a ground path may be varied as shown by ground path 262 in FIG. 3D where, compared to shield 212 in FIG. 3B, selected spokes 220 of shield 212 have been omitted.

In other embodiments, variations of shields 112 and 212 may be used with differential inductors with a multi-turn format (not shown) instead of the single loop inductors 102 and 202 in the above embodiments.

FIG. 4 is a circuit diagram illustrating one embodiment of controlled oscillator 280. As noted above, controlled oscillator 280 includes varactor 284, resistor 286 that represents the lossy component from inductor 100 or 200, varactor 284, etc., and amplifier 288 in parallel with either shielded differential inductor 100 or shielded differential inductor 200. Connecting bars 142 and 144 are included for embodiments with shielded differential inductor 100 to form at least a portion of the parallel connections, and connecting bars 242 and 244 are included for embodiments with shielded differential inductor 200 to form at least a portion of the parallel connections.

Controlled oscillator 280 oscillates at frequencies determined by the combination of inductance and capacitance provided by inductor 100 or 200 and varactor 284 (i.e., an LC tank), respectively. Amplifier 288 provides power to sustain the oscillations. The frequency of controlled oscillator may be controlled by adjusting a voltage provided to varactor 284 to adjust the capacitance of varactor 284 in one embodiment.

Figure 5:
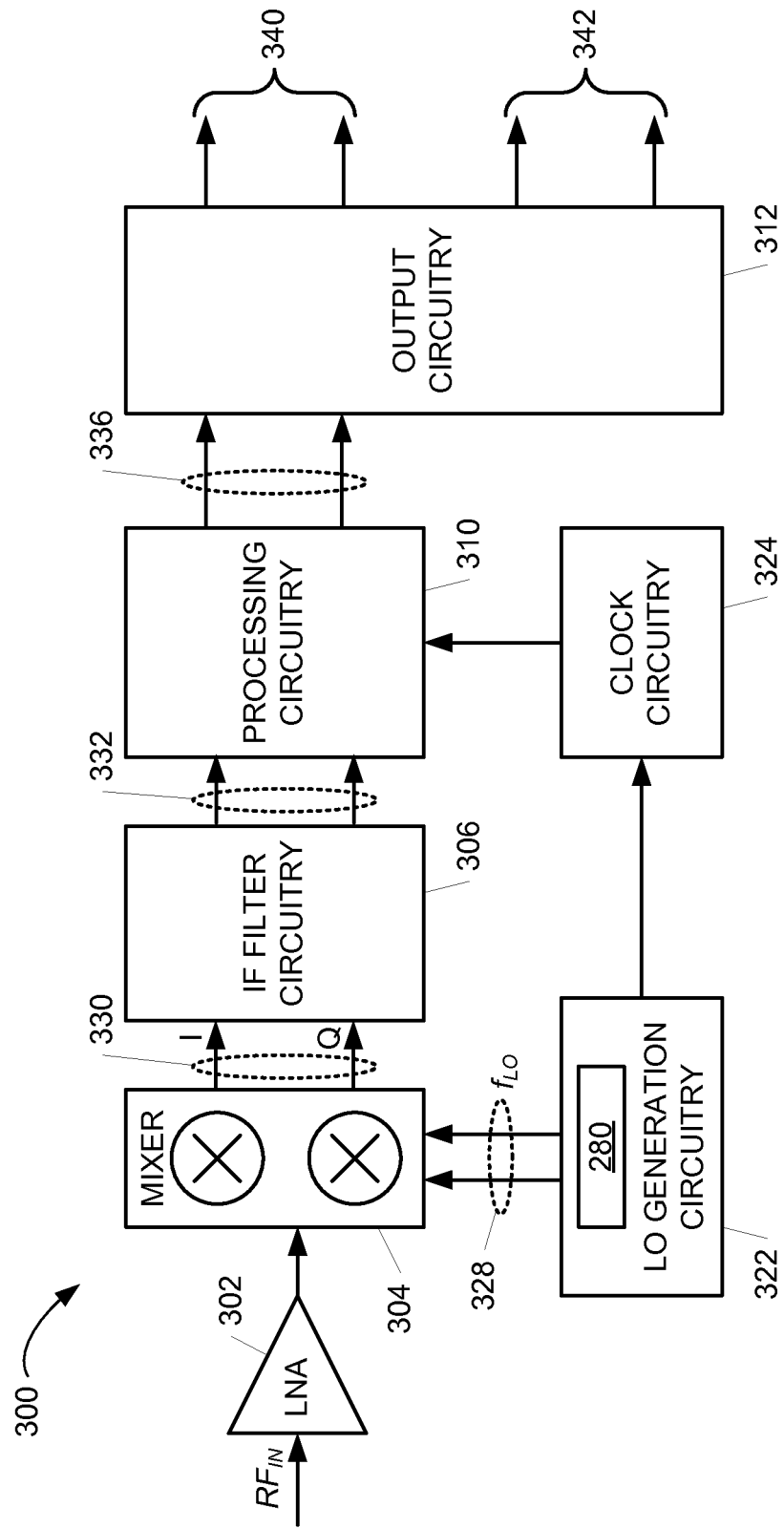
FIG. 5 is a block diagram illustrating one embodiment of selected portions of a communications device.

Inductors 100 and 200 may be used with respect to a wide variety of communications systems. FIG. 5 is a block diagram illustrating one embodiment of selected portions of a low intermediate frequency (low-IF) receiver 300 with an inductor 100 or 200 in a controlled oscillator 280. Receiver 300 includes a low noise amplifier (LNA) 302, a mixer 304, low intermediate frequency (IF) filter circuitry 306, processing circuitry 310, output circuitry 312, local oscillator generation circuitry 322 with controlled oscillator 280, and clock circuitry 324.

Receiver 300 is configured to receive a radio-frequency (RF) signal ($RF_{IN}$) and process the RF signal to generate a digital audio and/or video media output 340 and/or an analog audio and/or video media output 342. Receiver 300 forms an integrated terrestrial or cable broadcast receiver configured to receive RF signals. As used herein, an RF signal means an electrical signal conveying useful information and having a frequency from about 3 kilohertz (kHz) to thousands of gigahertz (GHz), regardless of the medium through which the signal is conveyed. Thus, an RF signal may be transmitted through air, free space, coaxial cable, and/or fiber optic cable, for example. Accordingly, receiver 300 may receive the RF signal from a wired or wireless medium. In other embodiments, receiver 300 may be configured to receive signals in another suitable frequency range.

LNA 302 receives the RF signal and generates an amplified output signal. The output of LNA 102 is then applied to mixer 304, and mixer 304 generates real (I) and imaginary (Q) output signals, as represented by signals 330. To generate low-IF signals 330, mixer 304 uses phase shifted local oscillator (LO) mixing signals 328. LO generation circuitry 322 includes controlled oscillator 280 (shown in FIG. 4) and outputs two out-of-phase LO mixing signals 328 generated, in part, by inductor 100 or 200 and provided to mixer 304. The outputs of mixer 304 are at a low-IF which may be fixed or designed to vary, for example, if discrete step tuning is used for LO generation circuitry 322. LO generation circuitry 322 also provides a reference signal to clock circuitry 324. Clock circuitry 324 generates a clock signal from the reference signal and provides the clock signal to processing circuitry 310.

Low-IF filter circuitry 306 receives the real (I) and imaginary (Q) signals 330 and outputs real and imaginary digital signals, as represented by signals 332. Low-IF filter circuitry 306 provides, in part, signal gain, signal filtering, and analog to digital conversion functions. Mixer 304 mixes the target channel within the input signal spectrum down to an IF. The IF may be fixed at a particular frequency or may vary within a low-IF ranges of frequencies, depending upon the LO generation circuitry utilized and how it is controlled. Low-IF filter circuitry 306 converts the real (I) and imaginary (Q) signals to a baseband signal in the digital domain and provides digital real (I) and imaginary (Q) baseband signals 332 to processing circuitry 310.

Processing circuitry 310 performs digital filtering and digital signal processing to further tune and extract the signal information from digital signals 332. Processing circuitry 310 produces baseband digital media signals 336. When the input signals relate to analog television broadcasts, the digital processing provided by processing circuitry 310 may include, for example, analog television demodulation. Processing circuitry 310 provides baseband digital media signals 336 to output circuitry 312.

Output circuitry 312 outputs baseband digital media signals 336 as digital media output signals 340 in any suitable digital format such as an IF I/Q format (e.g., low-IF (LIF) or zero-IF (ZIF) I/Q). Output circuitry 312 may also convert the digital baseband digital media signals 336 into analog media output signals 342 in any suitable analog format such as composite video baseband signal (CVBS) and/or sound IF/audio frequency (SIF/AF).

FIG. 6 is a block diagram illustrating one embodiment of a media system 400 that includes communications device 300 with inductor 100 or 200 in controlled oscillator 280 as shown in FIG. 5. Media system 400 may be any type of portable or non-portable system configured to provide a media output such as a mobile or cellular telephone, a personal digital assistant (PDA), an audio and/or video player (e.g., an MP3 or DVD player), and a notebook or laptop computer.

Media system 400 includes communications device 300 that receives a media transmission from an antenna 402 or other suitable input and provides a digital and/or analog media signal to a processing unit 404. Processing unit 404 performs any suitable processing on the media signal (e.g., television demodulation on a digital baseband signal) and provides the processed signal to a media output unit 406 for output to a user. Processing unit 404 may be omitted in some embodiments such that the media signal from communications device 300 may be provided directly to media output unit 406 in these embodiments. Media output unit 406 may include any suitable type and/or combination of audio and/or video output devices such as a television, a monitor, a display screen, a speaker, or headphones.

An input/output unit 408 receives inputs from a user and provides the inputs to communications device 300, processing unit 404, and/or media output device 406. Input/output unit 408 also receives outputs from communications device 300, processing unit 404, and/or media output device 406 and provides the outputs to a user. The inputs and outputs may include voice and/or data communications, audio, video, image, and/or other graphical information. Input/output unit 408 includes any number and types of input and/or output devices to allow a user provide inputs to and receive outputs from media system 400. Examples of input and output devices include a microphone, a speaker, a keypad, a pointing or selecting device, and a display device.

In the above embodiments, a variety of circuit and process technologies and materials may be used to implement the circuitries, devices, and systems. Examples of such technologies include metal oxide semiconductor (MOS), p-type MOS (PMOS), n-type MOS (NMOS), complementary MOS (CMOS), silicon-germanium (SiGe), gallium-arsenide (GaAs), silicon-on-insulator (SOI), bipolar junction transistors (BJTs), and a combination of BJTs and CMOS (BiCMOS).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An apparatus formed on a substrate, the apparatus comprising:
   an inductor; and
   a shield including a first set of finger structures formed in proximity to a first portion of the inductor and a ground connection connected to the first set of finger structures, each of the finger structures in the first set extending beyond a width of the first portion of the inductor in a first direction that is orthogonal to a second direction of current flow in the first portion of the inductor;
   wherein the inductor includes a differential inductor with first and second conductive loops coupled in series; and
   where the first and second conductive loops do not overlap and are arranged in side-by-side relationship.

2. The apparatus of claim 1 wherein the first and the second conductive loops are configured such that a first magnetic field of the first conductive loop at least partially cancels a second magnetic field of the second conductive loop.

3. The apparatus of claim 1 wherein the first conductive loop includes the first portion, and wherein the ground connection includes a first connector that connects to each of the first set of finger structures and a first conductor that connects to the first connector and extends to a center point of the first conductive loop.

4. An apparatus formed on a substrate, the apparatus comprising:
   an inductor; and
   a shield including a first set of finger structures formed in proximity to a first portion of the inductor and a ground connection connected to the first set of finger structures, each of the finger structures in the first set extending beyond a width of the first portion of the inductor in a first direction that is orthogonal to a second direction of current flow in the first portion of the inductor;

wherein the inductor includes a differential inductor with first and second conductive loops coupled in series;

wherein the first conductive loop includes the first portion, and wherein the ground connection includes a first connector that connects to each of the first set of finger structures and a first conductor that connects to the first connector and extends to a center point of the first conductive loop;

wherein the shield includes a second set of finger structures formed in proximity to a second portion of the inductor and connected to the ground connection, wherein each of the finger structures in the second set extending beyond a width of the second portion of the inductor in a third direction that is orthogonal to a fourth direction of current flow in the second portion of the inductor, and wherein the third direction differs from the first direction.

5. The apparatus of claim 4 wherein the first conductive loop includes the second portion, and wherein the ground connection includes a second connector that connects to each of the second set of finger structures and a second conductor that connects to the second connector and extends to the center point of the first conductive loop.

6. The apparatus of claim 5 wherein the shield includes a third set of finger structures formed in proximity to a third portion of the inductor and connected to the ground connection, wherein each of the finger structures in the third set extending beyond a width of the third portion of the inductor in a fifth direction that is orthogonal to a sixth direction of current flow in the second portion of the inductor, wherein the second conductive loop includes the third portion, and wherein the ground connection includes a third connector that connects to each of the third set of finger structures and a third conductor that connects to the third connector and extends to a center point of the second conductive loop.

7. The apparatus of claim 4 wherein the second conductive loop includes the second portion, and wherein the ground connection includes a second connector that connects to each of the second set of finger structures and a second conductor that connects to the second connector and extends to a center point of the second conductive loop.

8. The apparatus of claim 1 further comprising:
core circuitry symmetrically positioned with respect to a point of the inductor where a minimum voltage swing of the inductor occurs.

9. The apparatus of claim 1 further comprising:
a substrate;
wherein the inductor and the shield are formed on the substrate, and wherein an area underneath the inductor on the substrate comprises raw substrate.

10. The apparatus of claim 1 where the ground connection includes a first connector that connects to each of the first set of finger structures; and
where the connector does not extend substantially beyond outer finger structures of the first set of finger structures.

11. The apparatus of claim 1, where the separate first and second conductive loops are arranged substantially in the shape of a figure eight.

12. The apparatus of claim 1, where the separate first and second conductive loops are formed in one conductive metal layer.

13. The apparatus of claim 1, where the separate first and second conductive loops have respective center points that are different from each other.

14. The apparatus of claim 13 further comprising:
core circuitry positioned between the center point of the first conductive loop and the center point of the second conductive loop.

15. The apparatus of claim 1, where the inductor further comprises a crossover section, the first and second conductive loops being coupled in series by the crossover section; and where the core circuitry is symmetrically located under the cross over section.

16. The apparatus of claim 15, where the first and second conductive loops of the inductor are arranged in side by side relationship in an x-y plane; where the inductor further comprises a crossover section, the first and second conductive loops being coupled in series by the crossover section; where the first conductive loop includes a first terminal; where the second conductive loop includes a second terminal; and where crossover section is disposed in the x-y plane between the first and second terminals.

17. The apparatus of claim 3 wherein the shield includes a second set of finger structures formed in proximity to a second portion of the inductor and connected to the ground connection, wherein each of the finger structures in the second set extending beyond a width of the second portion of the inductor in a third direction that is orthogonal to a fourth direction of current flow in the second portion of the inductor, and wherein the third direction differs from the first direction.

18. The apparatus of claim 17 wherein the first conductive loop includes the second portion, and wherein the ground connection includes a second connector that connects to each of the second set of finger structures and a second conductor that connects to the second connector and extends to the center point of the first conductive loop.

19. The apparatus of claim 18 wherein the shield includes a third set of finger structures formed in proximity to a third portion of the inductor and connected to the ground connection, wherein each of the finger structures in the third set extending beyond a width of the third portion of the inductor in a fifth direction that is orthogonal to a sixth direction of current flow in the second portion of the inductor, wherein the second conductive loop includes the third portion, and wherein the ground connection includes a third connector that connects to each of the third set of finger structures and a third conductor that connects to the third connector and extends to a center point of the second conductive loop.

20. The apparatus of claim 17 wherein the second conductive loop includes the second portion, and wherein the ground connection includes a second connector that connects to each of the second set of finger structures and a second conductor that connects to the second connector and extends to a center point of the second conductive loop.

* * * * *